United States Patent [19]

Mizui

[11] Patent Number: 5,939,344
[45] Date of Patent: Aug. 17, 1999

[54] MICROWAVE DIELECTRIC PORCELAIN COMPOSITION

[75] Inventor: Toshihiro Mizui, Ise, Japan

[73] Assignee: NGK Spark Plug Co., Ltd., Aichi, Japan

[21] Appl. No.: 09/187,415

[22] Filed: Nov. 6, 1998

[30] Foreign Application Priority Data

Nov. 6, 1997 [JP] Japan ..................................... 9-322257
Mar. 24, 1998 [JP] Japan ................................... 10-096647

[51] Int. Cl.$^6$ ................................................... C04B 35/465
[52] U.S. Cl. ........................................... 501/136; 501/135
[58] Field of Search ...................................... 501/135, 136

[56] References Cited

U.S. PATENT DOCUMENTS

| | | |
|---|---|---|
| 4,438,214 | 3/1984 | Masuyama et al. . |
| 5,208,727 | 5/1993 | Okamoto et al. . |
| 5,320,991 | 6/1994 | Takahashi et al. ........................ 501/136 |
| 5,521,130 | 5/1996 | Nakamura et al. ...................... 501/136 |
| 5,840,642 | 11/1998 | Kim et al. ................................ 501/136 |

FOREIGN PATENT DOCUMENTS

| | | | |
|---|---|---|---|
| 0 882 688 | 12/1998 | European Pat. Off. . | |
| 52-118599 | 10/1977 | Japan ................................ H01B 3/12 |
| 2-129065 | 5/1990 | Japan ............................. C04B 35/46 |

*Primary Examiner*—Karl Group
*Attorney, Agent, or Firm*—Sughrue, Mion, Zinn, Macpeak & Seas, PLLC

[57] ABSTRACT

The present invention provides a microwave dielectric porcelain composition having excellent properties, i.e., practically sufficient relative dielectric constant and unloaded Q value and a very small absolute temperature coefficient of resonant frequency. A novel microwave dielectric porcelain composition is provided, comprising a main component represented by the general formula $(Ca_x, Sr_y, Nd_z)_{1+a}TiO_{3+b}$ [in which x, y and z each represent a molar ratio, with the proviso that x, y and z satisfy the following relationships: $x+y+z=1$, $0.780 \leq x \leq 0.900$, $0.010 \leq y \leq 0.120$, $0.090 \leq z \leq 0.130$; a represents a number of from not less than 0.010 to not more than 0.300; and b represents a number of from not less than 0.100 to not more than 1.000], $Al_2O_3$, and at least one of oxides of elements other than Ca, Sr, Nd, Ti and Al, wherein the contents of $Al_2O_3$ and said at least one of oxides of elements other than Ca, Sr, Nd, Ti and Al are from 10 to 12% by weight and from 1 to 2%, respectively, based on 100% by weight of the main component. The oxides are preferably $Nb_2O_3$ and $MnO_2$.

6 Claims, 1 Drawing Sheet

MICROWAVE DIELECTRIC PORCELAIN COMPOSITION

FIELD OF THE INVENTION

The present invention relates to a microwave dielectric porcelain composition (hereinafter referred to as "dielectric porcelain composition" comprising a main component having a specific crystalline structure, $Al_2O_3$ and other oxides. The dielectric porcelain composition according to the present invention can be used as microwave circuit board, impedance matching member for various microwave circuits or the like besides as dielectric resonator in microwave range.

BACKGROUND OF THE INVENTION

A dielectric porcelain composition tends to exhibit an increased dielectric loss as the frequency used becomes high. Therefore, a dielectric porcelain composition which exhibits a high relative dielectric constant (hereinafter referred to as "$\epsilon_r$") and a high unloaded Q value (hereinafter referred to as "Qu") in the microwave frequency range has been desired. As this kind of a dielectric porcelain composition there has heretofore been known one having a crystalline structure comprising two phases, i.e., perovskite phase and illmenite phase (as disclosed in JP-A-2-129065 (The term "JP-A" as used herein means an "unexamined published Japanese patent application")). A dielectric porcelain composition comprising $MgTiO_3$ and $TiO_2$ mixed with a predetermined amount of $CaTiO_3$ has been known as well (as disclosed in JP-A-52-118599).

However, the former dielectric porcelain composition is disadvantageous in that it contains a considerable amount of other components such as $Nd_2O_3$, $La_2O_3$, PbO and ZnO and doesn't always have a high Qu. The latter dielectric porcelain composition comprises $TiO_2$ as an essential component and thus is disadvantageous in that the temperature coefficient of resonant frequency (hereinafter referred to as "$\tau_f$") makes a great positive or negative change when the mixing ratio of $CaTiO_3$ falls within a range of from 3 to 10% by weight, making it difficult to adjust the temperature coefficient $\tau_f$ to a small value close to zero.

SUMMARY OF THE INVENTION

It is therefore an object of the present invention to provide a dielectric porcelain composition which exhibits excellent dielectric properties, i.e., practically sufficient $\epsilon_r$ and $Q_u$, particularly $Q_u$ as high as 3,500 to 4,200, more particularly 3,700 to 4,200, and $\tau_f$ value as very small as 0 to +8.0 ppm/°C., particularly 0 to +7.0 ppm/°C.

The foregoing object of the present invention will become more apparent from the following detailed description and examples.

BRIEF DESCRIPTION OF THE DRAWING

By way of example and to make the description more clear, reference is made to the accompanying drawing in which.

DETAILED DESCRIPTION OF THE INVENTION

Figure 1:
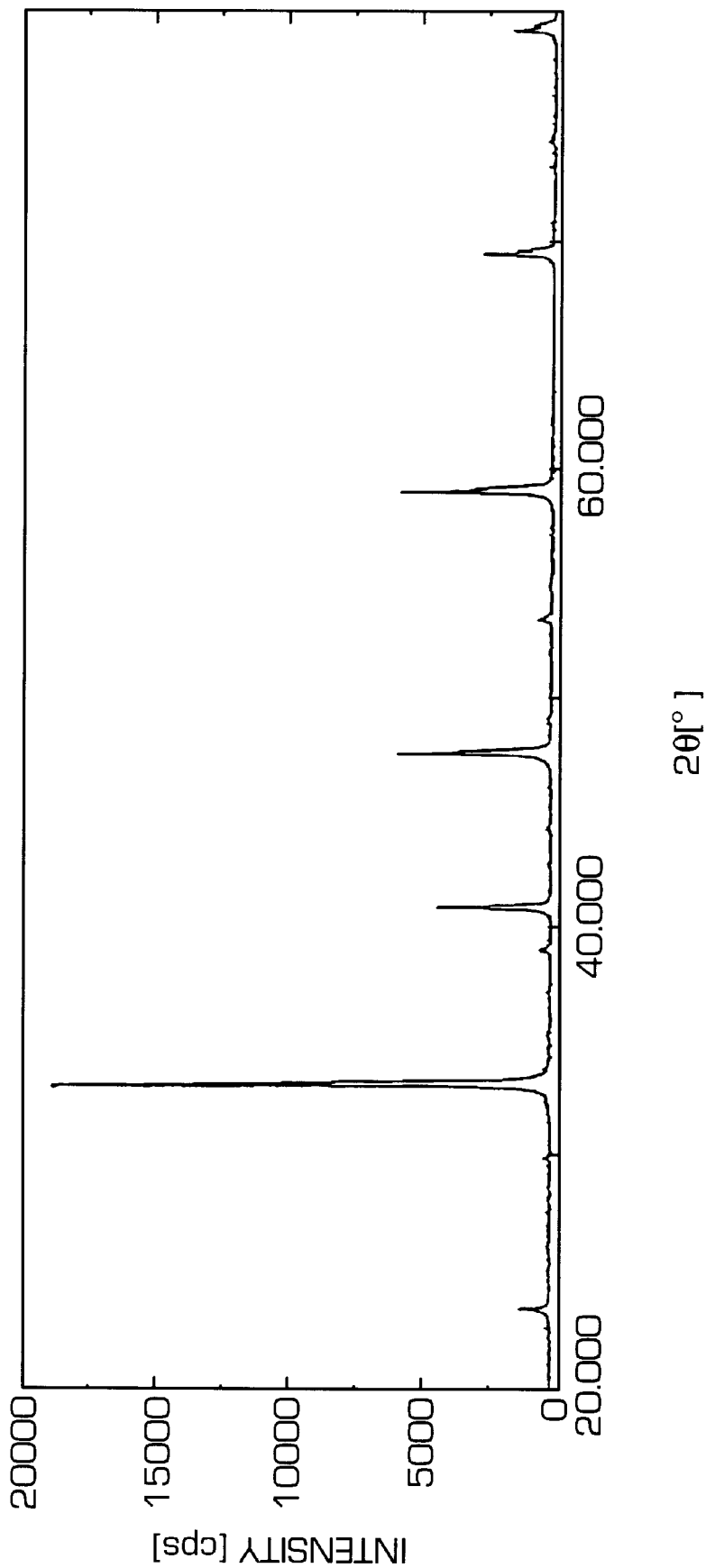
FIG. 1 is a chart illustrating the X-ray diffractometry of the dielectric porcelain composition of Experiment Example 4.

The first aspect of the present invention concerns a microwave dielectric porcelain composition, comprising a main component having a perovskite type crystalline structure represented by the general formula $(Ca_x, Sr_y, Nd_z)_{1+a}TiO_{3+b}$ [in which x, y and z each represent a molar ratio, with the proviso that x, y and z satisfy the following relationships: $x+y+z=1$, $0.780 \leq x \leq 0.900$, $0.010 \leq y \leq 0.120$, $0.090 \leq z \leq 0.130$; a represents a number of from not less than 0.010 to not more than 0.300; and b represents a number of from not less than 0.100 to not more than 1.000], $Al_2O_3$, and at least one of oxides of elements other than Ca, Sr, Nd, Ti and Al, wherein the contents of $Al_2O_3$ and said at least one of oxides of elements other than Ca, Sr, Nd, Ti and Al are from 10 to 12% by weight and from 1 to 2%, respectively, based on 100% by weight of the main component.

In accordance with the present invention, the use of a dielectric porcelain composition comprising the foregoing main component and a predetermined amount of $Al_2O_3$ and other oxides provides a composition which exhibits practically sufficient dielectric properties, i.e., $\epsilon_r$ of about 45 and $Q_u$ of from 3,100 to 4,200, particularly from 3,500 to 4,200. In particular, the dielectric porcelain composition according to the present invention can be provided with a $\tau_f$ value of from 0 to +13.0 ppm/°C., particularly from 0 to +8.0 ppm/°C., more particularly from 0 to +4.0 ppm/°C. Thus, a dielectric porcelain composition having very excellent properties can be provided.

The foregoing main component having a perovskite type crystalline structure represented by the foregoing general formula $(Ca_x, Sr_y, Nd_z)_{1+a}TiO_{3+b}$ can be produced by blending Ca, Sr, Nd and Ti oxides as they are or compounds which can become oxides when heated, such as carbonates of these elements, e.g., $CaCO_3$ and $SrCO_3$, in the form of powder, and then sintering the blend. The incorporation of $Al_2O_3$ and the foregoing oxides into the main component can be accomplished by blending the main component with oxides of Al and the foregoing elements as they are or by blending the main component with Al and compounds of these elements which can become oxides when heated, such as carbonates of these elements, and then sintering the blend.

If the foregoing suffix x falls below 0.780 or exceeds 0.900, the resulting dielectric porcelain composition tends to exhibit a reduced $Q_u$ value. If the foregoing suffix y falls below 0.010, both $\epsilon_r$ and $Q_u$ decrease and $\tau_f$ decreases beyond -10 ppm/°C. On the contrary, if the foregoing suffix y exceeds 0.120, the resulting dielectric porcelain composition tends to exhibit a reduced $Q_u$ value and a $\tau_f$ value of greater than +13.0 ppm/°C. If the foregoing suffix z falls below 0.090, $\tau_f$ tends to show a positive increase. On the contrary, if the foregoing suffix z exceeds 0.130, $\tau_f$ tends to show a negative increase.

In the dielectric porcelain composition according to the present invention, the composition of the main component preferably satisfies the relationships $0.820 \leq x \leq 0.900$, $0.010 \leq y \leq 0.070$, and $0.090 \leq z \leq 0.130$, as claimed in the second aspect of the present invention, more preferably $0.840 \leq x \leq 0.900$, $0.010 \leq y \leq 0.050$, and $0.090 \leq z \leq 0.130$, as claimed in the third aspect of the present invention.

In accordance with the present invention, as claimed in the second and third aspects of the present invention, further specification of x, y and z makes it possible to obtain a dielectric porcelain composition having better dielectric properties. In the second aspect of the present invention, $Q_u$ and $\tau_f$ value can be predetermined to a range of from 3,500 to 4,200, preferably from 3,700 to 4,200, and a range of from 0 to +8.0 ppm/°C., preferably from 0 to +7.0 ppm/° C., respectively. In the third aspect of the present invention, $Q_u$ and $\tau_f$ value can be predetermined to a range of from 3,500 to 4,200, preferably from 3,700 to 4,200, and a range of from 0 to +4.0 ppm/°C., preferably from 0 to +2.5 ppm/°C., respectively, with $\epsilon_r$ being approximately 45. Thus, a dielectric porcelain composition having very excellent dielectric properties can be obtained.

On the other hand, if the content of $Al_2O_3$ falls below 10% by weight, the resulting dielectric porcelain composition exhibits a drastically reduced $Q_u$ value. On the contrary, if the content of $Al_2O_3$ exceeds 12% by weight, the resulting dielectric porcelain composition tends to exhibit a reduced $Q_u$ value and a $\tau_f$ value which increases towards positive side. It is particularly preferred that the content of $Al_2O_3$ range from about 11 to 12% by weight.

Examples of the foregoing oxides of elements other than Ca, Sr, Nd, Ti and Al include $Nb_2O_5$, $Ta_2O_5$, $MnO_2$, ZnO, $Sb_2O_3$, and $Y_2O_3$. These oxides may be used singly or in combination of two or more thereof. If the content of these oxides falls below 1% by weight, the resulting blend exhibits a deteriorated sinterability. In particular, if no oxides are incorporated in the blend, the resulting blend exhibits an insufficient sinterability that makes it impossible to obtain the desired dielectric porcelain composition. On the contrary, if the content of these oxides exceeds 2% by weight, the resulting dielectric porcelain composition exhibits a drastically reduced $Q_u$ value.

ties. In other words, the incorporation of a small amount of SrO in the main component allows the blend to be sintered at a temperature as low as from 50 to 100° C. lower than used in the prior art, making it easy to obtain a dense sintered product.

The present invention will be further described in the following examples, but the present invention should not be construed as being limited thereto.

(1) Examination of ratio of y(Sr)

As starting materials there were used $Nd_2O_3$ powder (purity: 99.9%), $Al_2O_3$ powder (purity: 99.9%), $CaCO_3$ powder (purity: 99.5%), $SrCO_3$ powder (purity: 97.0%), $TiO_2$ powder (purity: 99.98%), $Nb_2O_5$ powder (purity: 99.9%) and $MnO_2$ powder (purity: 96.0%).

These starting materials were measured out in amounts such that x, y and z in the composition formula $(Ca_x, Sr_y, Nd_z)_{1+a}TiO_{3+b}$ are as set forth in the column of Experiment Examples 1 to 9 in Table 1 and the content of $Al_2O_3$, $Nb_2O_5$ and $MnO_2$ are as set forth in the column of Experiment Examples 1 to 9 in Table 1. The symbol * in Table 1 indicates an example falling outside the first aspect of the present invention.

TABLE 1

|    | x     | y     | z     | a     | b     | $Al_2O_3$ (wt-%) | $Nb_2O_5$ (wt-%) | $MnO_2$ (wt-%) | $\epsilon_r$ | $Q_u$ (GHz) | $\tau_f$ (ppm/° C.) |
|----|-------|-------|-------|-------|-------|--------|--------|--------|------|-------|-------|
| *1 | 0.872 | —     | 0.128 | 0.147 | 0.885 | 11.67  |        |        | 42.0 | 2,000 | −15.0 |
| 2  | 0.878 | 0.010 | 0.111 | 0.125 | 0.750 | 11.55  |        |        | 44.8 | 3,700 | 0     |
| 3  | 0.864 | 0.020 | 0.116 | 0.114 | 0.758 | 11.78  | 1.0    | 0.1    | 45.0 | 4,000 | +1.5  |
| 4  | 0.847 | 0.033 | 0.120 | 0.124 | 0.797 | 11.93  |        |        | 45.0 | 4,200 | +2.5  |
| 5  | 0.825 | 0.060 | 0.105 | 0.178 | 0.799 | 10.32  |        |        | 45.2 | 3,700 | +7.0  |
| 6  | 0.814 | 0.080 | 0.105 | 0.180 | 0.800 | 10.23  |        |        | 45.3 | 3,300 | +10.0 |
| 7  | 0.796 | 0.100 | 0.104 | 0.162 | 0.767 | 10.95  |        |        | 45.0 | 3,300 | +11.0 |
| 8  | 0.781 | 0.114 | 0.106 | 0.175 | 0.797 | 11.08  |        |        | 45.2 | 3,100 | +13.0 |
| *9 | 0.763 | 0.137 | 0.100 | 0.258 | 0.889 | 10.66  |        |        | 45.9 | 3,000 | +15.5 |

As these oxides there are preferably used $Nb_2O_5$ and $MnO_2$ in combination as claimed in the fourth aspect of the present invention. If these oxides are used, the powder to be used as starting material exhibits an improved sinterability that makes it easy to obtain a dielectric porcelain composition having excellent dielectric properties. In particular, the incorporation of $Nb_2O_5$ makes it possible to provide stabilized properties even if the blend is sintered in a wide temperature range and obtain a sintered product having a high denseness. The content of $Nb_2O_3$ is preferably from 0.5 to 2.0% by weight, particularly from 0.7 to 1.5% by weight. The content of $MnO_2$ is preferably from 0.05 to 0.3% by weight, particularly from 0.05 to 0.25% by weight. If the content of $Nb_2O_5$ and $MnO_2$ fall within the above defined range, the blend can be sintered more stably, and a dielectric porcelain composition having well-balanced excellent properties can be obtained.

The dielectric porcelain composition according to the present invention is characterized by a main component represented by the general formula $(Ca_x, Sr_y, Nd_z)_{1+a}TiO_{3+b}$ wherein the content of SrO is very small. On the other hand, even if this main component is specified such that the content of SrO is higher with $Al_2O_3$ and oxides of elements such as Nb and Mn being incorporated therein, a dielectric porcelain composition having excellent properties can be similarly obtained. However, if the content of SrO is reduced as claimed herein, another effect, i.e., improved sinterability can be exerted as well besides improved dielectric proper- These powders were dry-blended by a mixer for 20 to 30 minutes, and then subjected to primary grinding by an oscillating mill. As the pebble there was used an alumina ball. The grinding time was 4 hours. Subsequently, the powder blend thus obtained was calcinated at a temperature of from 1,100° C. to 1,350° C. in the atmosphere. To the powder thus calcinated were then added a proper amount of an organic binder and water. The mixture was then subjected to secondary grinding by a Trommel mill. Thereafter, the powder blend thus processed was dried and granulated by a spray dryer. The material thus granulated was then sieved to obtain a powder having a grain size of from 40 to 200 meshes. The powder thus obtained was then compressed under a press to prepare a columnar molded product having a diameter of 19 mm and a thickness of 11 mm. The press pressure was 3 tons. The molding pressure was 1 ton/cm².

The molded product thus obtained was degreased, and then sintered at a temperature of 1,400° C. to 1,650° C. in the atmosphere for 2 to 6 hours. The sintered product was then polished at both ends thereof to obtain a column having a diameter of about 16 mm and a thickness of 8 mm. The columnar sintered product was measured for $\epsilon_r$, $Q_u$ and $\tau_f$ by means of a parallel conductor plate type columnar dielectric resonator ($TE_{011}$MODE) or the like.

The measurement of $\tau_f$ was effected at a temperature of from 25° C. to 80° C. The value of $\tau_f$ was calculated by the equation $\tau_f = (f_{80} - f_{25})/(f_{25} \times \Delta T)$ wherein $\Delta T$ is 55° C. (80° C.−25° C. The resonant frequency during measurement was 4 GHz. The results of $\epsilon_r$, $Q_u$ and $\tau f$ are set forth in Table 1.

The results set forth in Table 1 show that the products of Experiment Examples 2 to 8 according to the first aspect of the present invention exhibit $\epsilon_r$ of from 44.8 to 45.3, $Q_u$ of from 3,100 to 4,200 and $\tau_f$ of from 0 to +13.0 ppm/°C., providing dielectric porcelain compositions having practically sufficient dielectric properties. In particular, the products of Experiment Examples 2 to 5 according to the second aspect of the present invention exhibit $Q_u$ of from 3,700 to 4,200 and $\tau_f$ of from 0 to +7.0 ppm/° C., providing dielectric porcelain compositions having better dielectric properties. Further, the products of Experiment Examples 2 to 4 according to the third aspect of the present invention exhibit $Q_u$ of from 3,700 to 4,200, which is on the same level as that of the second aspect of the present invention, and $\tau_f$ of from 0 to +2.5 ppm/°C., providing dielectric porcelain compositions having even stabler and better dielectric properties. On the other hand, the dielectric porcelain composition of Experiment Example 1, wherein no SrO is incorporated, exhibits drastically reduced $\epsilon_r$ and Qu values and a $\tau_f$ value which shifts towards the negative side. Further, Experiment Example 9, wherein the content of SrO exceeds the upper limit, tends to exhibit a reduced $Q_u$ value and a $\tau_f$ value which shifts towards the positive side.

FIG. 1 is a chart illustrating the X-ray diffractometry of the dielectric porcelain composition of Experiment Example 4. The dielectric porcelain composition was identified by the use of a JCPDS card. As a result, it was found that the composition shown on the diffraction chart is a compound having a $CaTiO_3$ type crystalline structure. Thus, the dielectric porcelain composition according to the present invention was identified comprising a $CaTiO_3$ type crystalline structure.

Further, the value of $\epsilon_r$, $Q_u$ and $\tau_f$ were measured with the change of the content of $Al_2O_3$, $Nb_2O_5$ and $MnO_2$ with the composition of Experiment Example 4 of Table 1 as base composition. Dielectric porcelain compositions were prepared from these compositions in the same manner as mentioned above. The dielectric porcelain compositions thus prepared were then measured for dielectric properties in the same manner as mentioned above. The results are set forth in Table 2.

TABLE 2

| Basic composition (No. 4) | | $Al_2O_3$ (wt-%) | Oxide (wt-%) | | $\epsilon_r$ | $Q_u$ (GHz) | $\tau_f$ (ppm/° C.) |
|---|---|---|---|---|---|---|---|
| x = 0.847 | No. 4 | 11.93 | $Nb_2O_3$ | 1.0 | 45.0 | 4,200 | +2.5 |
|  |  |  | $MnO_2$ | 0.1 |  |  |  |
| y = 0.033 | (1) | 8.82 | $Nb_2O_5$ | 1.0 | 45.4 | 2,300 | +4.5 |
|  |  |  | $MnO_2$ | 0.1 |  |  |  |
| z = 0.120 | (2) | 14.11 | $Nb_2O_5$ | 1.0 | 46.0 | 3,100 | +16.0 |
|  |  |  | $MnO_2$ | 0.1 |  |  |  |
| a = 0.124 | (3) | 11.93 | — |  | Not Sintered |  |  |
| b = 0.797 | (4) | 11.93 | $Nb_2O_5$ | 4.0 | 44.8 | 2,500 | +7.5 |
|  |  |  | $MnO_2$ | 0.1 |  |  |  |
|  | (5) | 11.93 | $Nb_2O_5$ | 1.0 | 44.2 | 2,700 | +3.5 |
|  |  |  | $MnO_2$ | 2.0 |  |  |  |

The results set forth in Table 2 show that the product wherein the content of $Al_2O_3$ falls below the lower limit exhibits a drastically reduced $Q_u$ value while the product wherein the content of $Al_2O_3$ exceeds the upper limit exhibits a $\tau_f$ value which greatly shifts towards the positive side. The product free of $Nb_2O_5$ and $MnO_2$ could not provide a sintered product under the sintering conditions mentioned above. On the other hand, those having an oxide content exceeding the upper limit, i.e., the product wherein the content of $Nb_2O_5$ is as excessive as 4% by weight and the product wherein the content of $MnO_2$ is as excessive as 2% by weight exhibit a drastically reduced $Q_u$ value.

The form of the dielectric porcelain composition according to the present invention is not limited to the foregoing specific embodiments and may be varied within the scope of the present invention depending on the purpose. For example, as the starting materials of Ca component and Sr component there may be used peroxides, hydroxides and nitrates of Ca and Sr besides $CaCO_3$ and $SrCO_3$. Similarly, as the other oxides there may be also used various compounds which become oxides when heated.

The dielectric porcelain composition according to the first aspect of the present invention has a $CaTiO_3$ type crystalline structure and thus can exhibit practically sufficient dielectric properties. In accordance with the second and third aspects of the present invention, further specification of the composition makes it possible to obtain a dielectric porcelain composition having a higher $\epsilon_r$ value, a higher $Q_u$ value and a lower absolute $\tau_f$ value.

While the invention has been described in detail and with reference to specific embodiments thereof, it will be apparent to one skilled in the art that various changes and modifications can be made therein without departing from the spirit and scope thereof.

What is claimed is:

1. A microwave dielectric porcelain composition, which comprises:

a main component having a perovskite type crystalline structure represented by the following general formula:

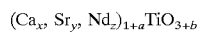

$$(Ca_x, Sr_y, Nd_z)_{1+a}TiO_{3+b}$$

wherein x, y and z each represent a molar ratio, with the proviso that x, y and z satisfy the following relationships: x+y+z = 1, $0.780 \leq x \leq 0.900$, $0.010 \leq y \leq 0.120$, $0.090 \leq z \leq 0.130$; a represents a number of from not less than 0.010 to not more than 0.300; and b represents a number of from not less than 0.100 to not more than 1.000;

$Al_2O_3$; and at least one of oxides of elements other than Ca, Sr, Nd, Ti and Al, wherein the contents of $Al_2O_3$ and said at least one of oxides of elements other than Ca, Sr, Nd, Ti and Al are from 10 to 12% by weight and from 1 to 2%, respectively, based on 100% by weight of the main component.

2. The microwave dielectric porcelain composition according to claim 1, wherein x satisfies the relationship $0.820 \leq x \leq 0.900$, y satisfies the relationship $0.010 \leq y \leq 0.070$, z satisfies the relationship $0.090 \leq z \leq 0.130$, the unloaded Q value thereof is from 3,500 to 4,200, and the temperature coefficient of resonant frequency is from 0 to +8.0 ppm/°C.

3. The microwave dielectric porcelain composition according to claim 1, wherein x satisfies the relationship $0.840 \leq x \leq 0.900$, y satisfies the relationship $0.010 \leq y \leq 0.050$, z satisfies the relationship $0.090 \leq z \leq 0.130$, the unloaded Q value thereof is from 3,500 to 4,200, and the temperature coefficient of resonant frequency is from 0 to +4.0 ppm/°C.

4. The microwave dielectric porcelain composition according to claim 1, wherein said at least one of oxides of elements other than Ca, Sr, Nd, Ti and Al are $Nb_2O_5$ and $MnO_2$.

5. The microwave dielectric porcelain composition according to claim 2, wherein said at least one of oxides of elements other than Ca, Sr, Nd, Ti and Al are $Nb_2O_5$ and $MnO_2$.

6. The microwave dielectric porcelain composition according to claim 3, wherein said at least one of oxides of elements other than Ca, Sr, Nd, Ti and Al are $Nb_2O_5$ and $MnO_2$.

* * * * *